United States Patent [19]
Lanford et al.

[11] Patent Number: 5,622,608
[45] Date of Patent: Apr. 22, 1997

[54] PROCESS OF MAKING OXIDATION RESISTANT HIGH CONDUCTIVITY COPPER LAYERS

[75] Inventors: William A. Lanford, Malden Bridge; Peijun Ding, Albany, both of N.Y.

[73] Assignee: Research Foundation of State University of New York, Albany, N.Y.

[21] Appl. No.: 219,131

[22] Filed: May 5, 1994

[51] Int. Cl.$^6$ .................................................. C23C 14/34
[52] U.S. Cl. ............................ 204/192.15; 204/192.17; 427/123; 427/376.6; 427/383.1; 148/277; 148/282; 438/768
[58] Field of Search ....................... 204/192.14, 192.15, 204/192.17, 298.26; 427/376.6, 383.1, 123, 124; 437/189, 195

[56] References Cited

U.S. PATENT DOCUMENTS 4,021,277  5/1977  Shirn et al. .................... 204/298.26 X
4,415,427  11/1983  Hidler et al. ...................... 204/298.26

OTHER PUBLICATIONS

Clyne et al.; "Proceedings of the 2nd European Conference on Advanced Materials and Processes" University of Cambridge, UK; Jul. 1991; vol. 1 *Advanced Processing* pp. 362–364.
Newberg et al.; "Thermal Conductivity and Microstructure Stability of Heat Treated Amzirc Copper–Based Alloys"; *Microstructural Science*; vol. 16; pp. 231–243.
"Copper's Expanding Role in Microelectronics"; *Advanced Materials & Processes Inc. Metal Progress*; Dec. 1987; pp. 54–60.
Arcot et al.; "Intermetallic Reactions Between Copper and Magnesium as an Adhesion/Barrier Layer"; *Mat. Res. Soc. Symp. Proc.*, vol. 225; pp. 231–236.
Itow et al.; "Self–aligned passivation on copper interconnection durability against oxidizing ambient annealing"; *Appl. Phys. Lett.*; vol. 63, No. 7; Aug. 1993; pp. 934–936.
Jian Li et al.; "Refractory Metal Nitride Encapsulation for Copper Wiring"; *MRS Bulletin*; Jun. 1993; pp. 52–56.
Ding et al.; "Ion Implantation to Inhibit Corrosion of Copper"; *Mat. Res. Soc. Symp. Proc.*; vol. 265 (1992); pp. 199–204.
Ding et al.; "Observation of Reduced Oxidation Rates for Plasma–Assisted CVD Copper Films" *Mat. Res. Soc. Symp. Proc.*; vol. 309; (1993) pp. 455–460.
Ding et al.; "Annealing of boron–implanted corrosion resistant copper films"; *J. Appl. Phys.* 74 (2), Jul. 1993; pp. 1331–1334.

*Primary Examiner*—Nam Nguyen
*Attorney, Agent, or Firm*—Bell, Seltzer, Park & Gibson, P.A.

[57] ABSTRACT

A process for preparing an oxidation resistant, electrically conductive copper layer on a substrate, and copper layers so formed, are disclosed. A copper layer is deposited onto the surface of a substrate, and subsequently annealed. The copper layer includes magnesium in an amount sufficient to form an inert magnesium oxide layer at the surface of the copper layer upon annealing.

14 Claims, 6 Drawing Sheets

PROCESS OF MAKING OXIDATION RESISTANT HIGH CONDUCTIVITY COPPER LAYERS

FIELD OF THE INVENTION

The present invention relates to microelectronic device manufacturing and more particularly to manufacturing high conductivity layers for microelectronic applications.

BACKGROUND OF THE INVENTION

Typically in the production of very large scale integrated (VLSI) circuits, ultra large scale integrated (ULSI) circuits, and other microelectronic devices, aluminum is widely used as a conductive interconnect material. Alternatives to aluminum are being investigated, however, since the performance of such devices may be limited by the circuit interconnections. Copper is one such alternative, primarily because of its higher electrical conductivity and its good electromigration properties. See, for example, S. P. Murarka, in Proc. of the Workshop on "Tungsten and Other Advanced Metals for ULSI Application 1990," Eds G. C. Smith and R. Blumarthal (MRS, Pittsburgh, Pa., 1991), p. 179.

Copper, however, unlike aluminum, oxidizes rapidly, thus impacting its usefulness as interconnect material. A number of processes of passivating thin copper films have been explored, including ion implantation, formation of surface silicides, and plasma treatment. H. M. Naguib, et al., *J. Vac. Sci. Tech.* 13, 396 (1976); P. J. Ding, et al., *Proc. MRS Syrup.* 260, 757 (1992); P. J. Ding, et al., *J. Appl. Phys.* 74, 1331 (1993); S. Hymes, et al., *J. Appl. Phys.* 71, 4623 (1992); P. J. Ding, et al., *Proc. MRS Symp.* 309, 455 (1993).

In addition, pure copper does not adhere well to insulating layers used in microelectronic devices, such as silicon dioxide ($SiO_2$). Other techniques have explored the use of an adhesive layer to provide good adhesion between the copper and the insulating layers. Recently, the use of magnesium as a diffusion barrier to be used with copper has been investigated. B. Arcot, et al., *Mat. Res. Soc. Symp. Proc.* 225, 231–236 (1991). The article reports investigations of the kinetics of the phase formation sequence in copper-magnesium bilayers sputtered onto silicon dioxide on silicon substrates.

While all of these processes are effective to some degree, a process has not been developed that clearly meets all the needs of microelectronic device manufacturing, such as good conductivity, oxidation resistance and good adhesion to underlayers.

SUMMARY OF THE INVENTION

It is therefore an object of the present invention to provide an improved process for forming copper layers, and copper layers so formed.

It is another object of the present invention to provide an improved process for forming oxidation resistant, high conductivity copper layers, and copper layers so formed.

It is another object of the present invention to provide an improved process for forming oxidation resistant, high conductivity copper layers which exhibit good adhesion to surfaces of underlayers, and copper layers so formed.

It is yet another object of the present invention to provide an improved process for forming oxidation resistant high conductivity copper layers which can be manufactured using existing processes and equipment, and copper layers so formed.

These and other objects are provided according to the present invention by a process of forming an oxidation resistant, conductive copper layer on a substrate. In the present invention, a copper film or layer is deposited onto the surface of a substrate, such as an oxidized silicon substrate, and then annealed. The copper in the copper layer includes a second metal in an amount sufficient to form an inert oxide layer at the surface of the copper layer when the copper layer is annealed. Preferably, the copper layer includes magnesium. More preferably, magnesium is present in the copper layer in an amount of at least about one tenth of one atomic percent, preferably at least about one atomic percent, and most preferably in an amount of at least about two atomic percent.

After the copper is deposited onto the substrate surface, the copper layer is annealed for a time sufficient and at a temperature sufficient to form the inert oxide layer at the surface thereof. Preferably, the copper layer is annealed in an inert atmosphere, such as argon, for at least about thirty minutes to a temperature of from about 275° C. to about 400° C. The oxide layer is believed to provide oxidation resistance to the layer.

Preferably the copper includes magnesium in an amount sufficient to form a $Cu_2Mg$ alloy. This can provide advantages in manufacturing. Existing techniques and equipment can be used to deposit and anneal the copper layers because an exact amount of magnesium, and exact anneal conditions, are not required to provide good conductivity and oxidation resistance to the copper layers. Thus, the magnesium provides good copper oxidation resistance properties to the layer without a corresponding substantial decrease in the conductivity of the layer.

The copper layer is deposited onto the surface of the substrate using techniques known in the art, preferably by sputtering. For example, the copper layer can be deposited by simultaneously exposing a copper target and a second metal target, such as a magnesium target, to an argon plasma, and by controlling the second metal content of the copper layer by supplying different power levels to the second metal target while keeping the copper target power supply constant. Alternatively, a composite target formed of copper and a second metal, such as magnesium, can be used.

The present invention also provides oxidation resistant conductive copper layers. The copper layers of the invention include an inert metal oxide layer, preferably a magnesium oxide layer, at the surface thereof. In addition, the invention provides microelectronic devices. The microelectronic device in accordance with the invention includes a semiconductor substrate having a face. An oxidation resistant conductive copper layer is provided on the face of the substrate. The copper layer includes an inert metal oxide, preferably magnesium oxide, layer at the surface of the copper layer opposite the face of the substrate.

The resultant annealed copper layer has a resistivity of about 2 $\mu\Omega\cdot$cm approaching that of pure sputtered copper. In addition, the copper layers formed in accordance with the present invention exhibit good adhesion to the substrate surface, and the surface thereof remains microscopically smooth, even upon heating the copper layer to temperatures as high as 700° C.

BRIEF DESCRIPTION OF THE DRAWINGS

In the drawings which form a portion of the original disclosure of the invention.

DETAILED DESCRIPTION OF THE INVENTION

The present invention will now be described more fully hereinafter with reference to the accompanying drawings, in which a preferred embodiment of the invention is shown. This invention may, however, be embodied in many different forms and should not be construed as limited to the embodiment set forth herein. Rather, this embodiment is provided so that the disclosure will be thorough and complete, and will fully convey the scope of the invention to those skilled in the art. Like numbers refer to like elements throughout. For purposes of clarity the scale has been exaggerated.

Figure 1A:
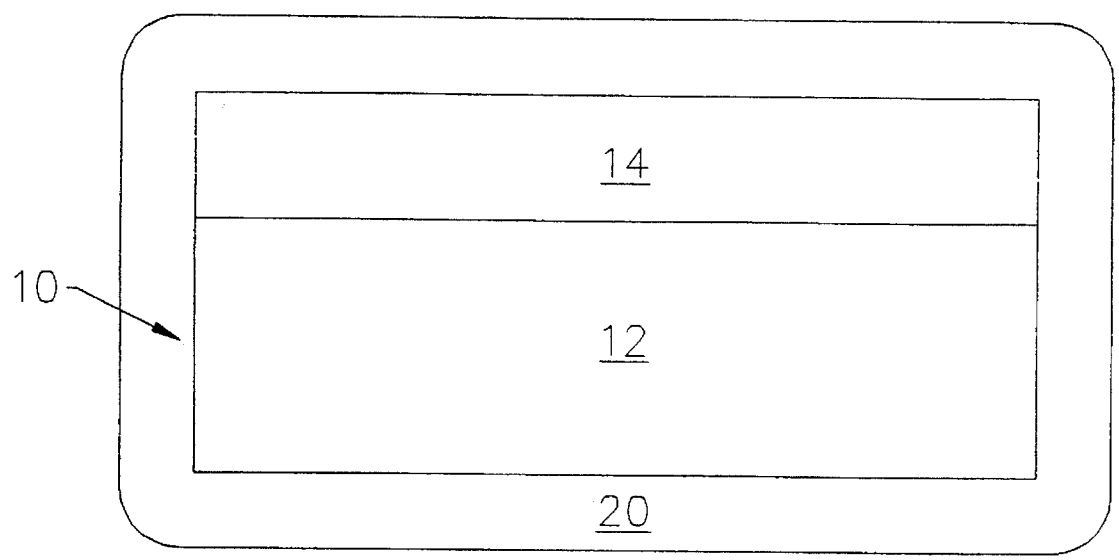
FIGS. 1A and 1B are side cross-sectional views of a semiconductor device in progressive stages of manufacture, illustrating a process for manufacturing the device.
Figure 1B:
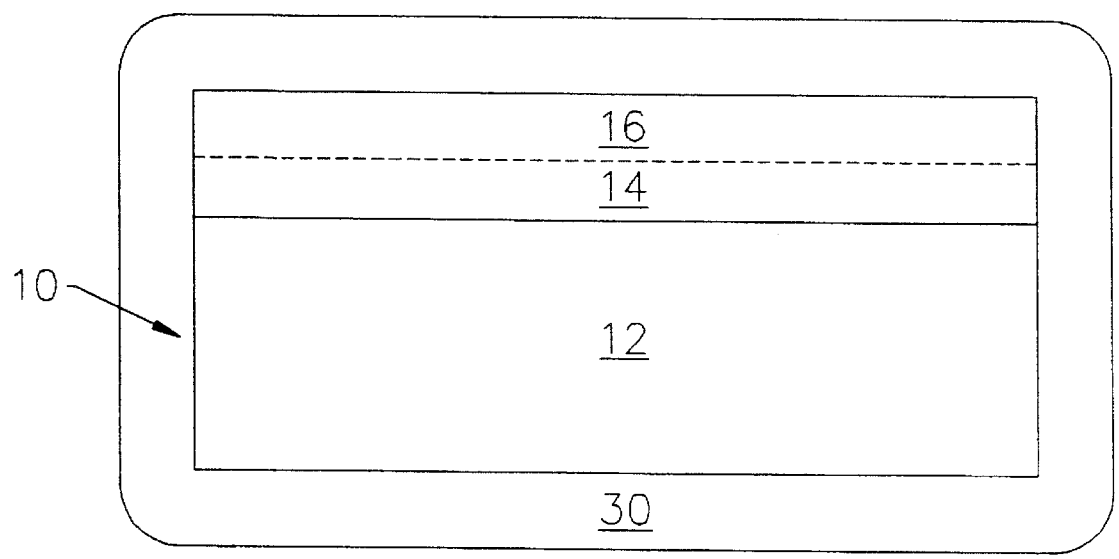

FIGS. 1A and 1B are side cross-sectional views of a semiconductor device in progressive stages of manufacture, and illustrate a process for manufacturing the device. Referring to FIG. 1A, a cross-sectional view of a microelectronic device having a face is illustrated. The microelectronic device is designated generally as 10 and may be, for example, a wafer for use in VLSI circuits, ULSI circuits, and the like. In FIG. 1A, microelectronic device 10 comprises an oxidized silicon substrate 12 having a face.

As indicated by Block 20, a copper layer 14 is deposited onto the face of substrate 12. As will be appreciated by the skilled artisan, the copper layer can be deposited directly onto the face of the substrate, or there can be intervening layers between the copper layer and the substrate. That is, the substrate can include multiple levels of conductive and insulating layers.

Referring now to FIG. 1B, copper layer 14 includes a second metal in an amount sufficient so that when the copper layer is annealed, at least a portion of the second metal in the copper layer migrates to the surface of the copper layer and forms an inert oxide protective layer 16. The specific metal selected has the following characteristics. First, as noted above, the metal migrates to the surface of the copper upon annealing and oxidizes, forming a thin stable oxide layer at the surface of the copper layer. Second, the metal should not significantly increase the resistivity of copper. For example, the metal can be one that is essentially insoluble with copper, and does not form compounds with copper which adversely affect the conductivity of the copper component. Alternatively, the metal can form an alloy with the copper which has a high conductivity. Exemplary metals include magnesium and tantalum.

In a preferred embodiment of the invention, the copper layer 14 includes magnesium in an amount sufficient so that when the copper layer is annealed, at least a portion of the magnesium in the copper layer migrates to the surface of the copper layer and forms an inert magnesium oxide protective layer. The magnesium oxide protective layer is substantially nonreactive in air, and accordingly forms a barrier between the surface of the copper layer 14 and the surrounding atmosphere so that the copper layer will not oxidize.

In addition, preferably the copper layer 14 includes magnesium in an amount sufficient to form an electrically conductive alloy with the copper when the copper layer is annealed. Accordingly, two different interactions occur upon annealing the copper layer 14. First, at least a portion of the magnesium migrates to the surface of the copper layer to form inert magnesium oxide compounds. The remaining magnesium in the copper layer forms a conductive copper-magnesium alloy, believed to have the formula $Cu_2Mg$. This alloy exhibits good electrical conductivity.

The formation of the conductive alloy is important particularly in context of manufacturing processes. The conductivity of the copper layer is not significantly decreased by the presence of another substance because magnesium remaining in the copper layer does not remain in solution in the copper, but rather forms a conductive alloy therewith. Thus the process of the invention is economically feasible in commercial applications, because precise or exact amounts of magnesium do not have to added to the copper to provide a desirable product. Accordingly typical microelectronic device fabrication equipment and techniques can be used.

As noted above, the resultant copper layers have good electrical conductivity properties, approaching that of pure copper. For example, when magnesium is added to the copper layer, magnesium is incorporated in an amount sufficient to provide a copper layer having a resistivity value of about 2 $\mu\Omega \cdot cm$ at substantially ambient temperatures. For purposes of comparison, pure copper layers exhibit a theoretical resistivity of about 1.67 $\mu\Omega \cdot cm$, and currently used aluminum based layers exhibit a resistivity of about 3.5 $\mu\Omega \cdot cm$. Preferably, the copper layer includes at least about one tenth of one atomic percent magnesium (which can be abbreviated as "Cu(0.1 at % Mg)" using a format known to those skilled in the art), more preferably at least about one atomic percent magnesium "Cu(1 at % Mg)" and most preferably at least about two atomic percent magnesium ("Cu(2 at % Mg)"), although up to about four to six percent magnesium can be present.

The copper layer 14 of the invention is applied to the face of substrate 12 in any of the ways known in the art. For example, copper layer 14 may be deposited by physical vapor deposition techniques, such as sputtering, and the like. Preferably the copper layer is applied to the face of the substrate by sputtering. As known to the skilled artisan, the term "sputtering" is used to describe the mechanism in which atoms are dislodged from the surface of a material with high energy particles, and includes the following basic steps: (1) the material to be deposited is physically converted to a vapor phase; (2) the vapor is transported across a region of reduced pressure from the source to the substrate; and (3) the vapor condenses on the substrate to form a thin film or layer. Power levels, pressure levels, sputtering gas, and other typical sputtering process conditions can vary according to the sputtering system used.

As will be appreciated by the skilled artisan, a mixture of two or more metals can be deposited by sputtering by cosputtering from multiple targets, or using a multicomponent or composite target. As known in the art the term "target" refers to the material that is to be sputter-deposited onto the substrate. The term "composite target" refers to two or more metals in unalloyed form with a selected ratio of surface areas mechanically arranged so that sputtering takes place simultaneously to yield an alloy in the deposited layer. In the present invention, the copper layer can be deposited using two individual targets, one a copper target and one a second metal target, such as a magnesium target, by simultaneously exposing each target to a plasma, preferably an argon plasma. Alternatively, the copper layer can be deposited using a composite target.

After the copper layer is deposited onto the surface of substrate 12, the copper layer 14 is then annealed, as indicated by Block 30 in FIG. 1B. Although not wishing to be bound by any explanation of the invention, it is presently believed that upon annealing, at least a portion of the magnesium migrates to the surface of the copper layer and forms magnesium oxide compounds which are chemically inert, as described above. In addition, it is presently believed that upon annealing the magnesium remaining in the copper layer forms an alloy with copper, also as described above.

Annealing can be conducted using techniques and apparatus as known in the art. Preferably annealing is conducted in an inert atmosphere, such as an argon, nitrogen, and the like. In addition, preferably annealing is conducted at a temperature of from about 275° C. to about 400° C. for at least about thirty minutes, although higher or lower temperatures and shorter or longer times can be used.

Figure 2:
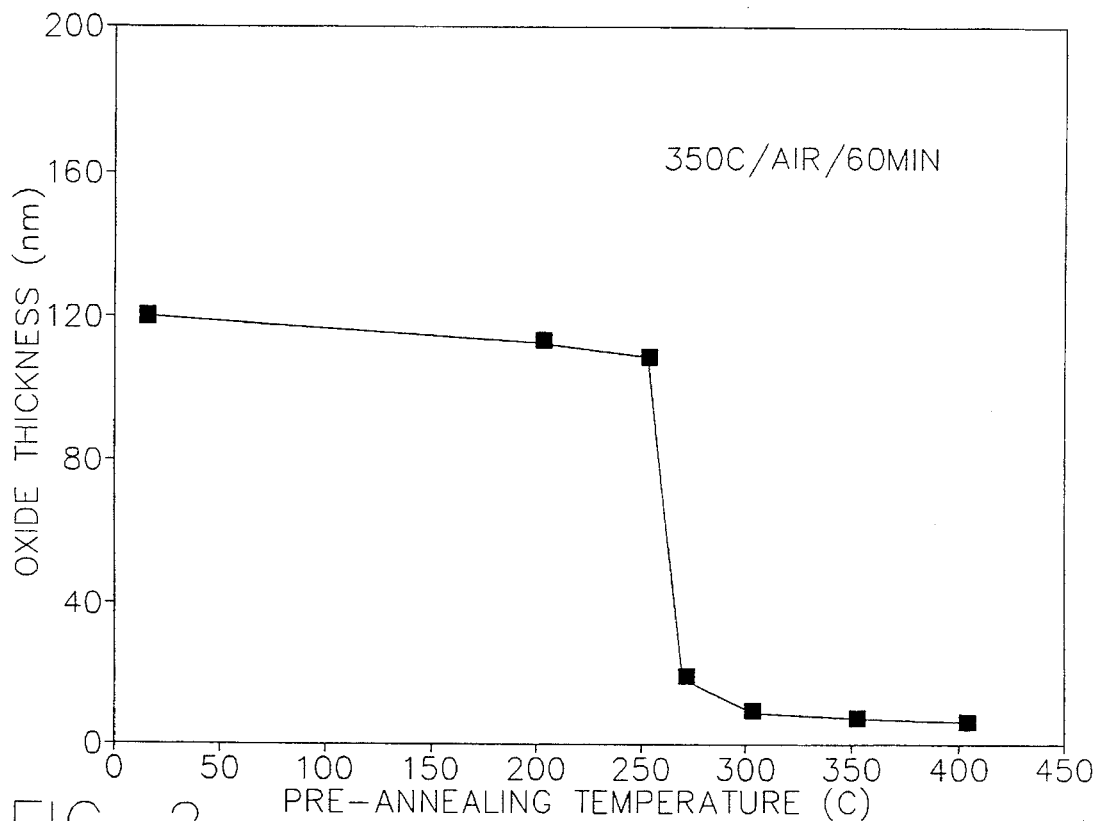
FIG. 2 is a graph illustrating oxide thickness of annealed copper(2 atomic % magnesium) films oxidized in air at 350° C. for one hour as a function of argon annealing temperature.

It has been discovered that good copper oxidation resistance can be achieved in accordance with the present invention using lower annealing temperatures, i.e., as low as about 275° C. to about 300° C. This is advantageous because of the increasing demand in the microelectronic field for lower processing temperatures. FIG. 2 is a graph illustrating oxide thickness of samples of Cu(2% Mg) films oxidized in air at 350° C. for one hour as a function of argon annealing temperatures (labeled pre-annealing temperature in FIG. 2). The data illustrates that good copper oxidation resistance can be achieved when annealing at temperatures as low as 275°–300° C.

As noted above, the surface oxide forms in the annealing processing step. As will be appreciated by the skilled artisan, it is believed that some small impurity of oxygen or water in the inert gas or in the reaction chamber reacts with the magnesium to form an oxide layer.

In addition to providing good copper oxidation resistance and conductivity, the copper layers of the invention also exhibit good adhesion to a substrate surface, particularly silicon dioxide. For example, a pure copper layer deposited upon a silicon substrate will not pass the "Scotch tape" test as known in the art, and is substantially removed. In contrast, the copper layers of the present invention do pass such a test, as explained in the examples below in more detail. Further, the copper layers of the invention remain substantially microscopically smooth upon annealing, even up to temperatures of about 700° C. In contrast, the surface of a pure copper layer becomes rough upon exposure to heat due to grain growth of the copper polycrystalline structure in the presence of heat.

After the copper layer has been deposited onto the surface of the substrate, the microelectronic device may be used as is or further processed. For example, the copper layer can be patterned using techniques known in the art such as chemical mechanical polishing. Alternatively, additional levels can be added to the device, such as additional insulating and/or conductive levels.

The present invention will be further illustrated by the following non-limiting examples.

EXAMPLE 1

Preparation of the Copper Films

Thin films of copper with various magnesium contents were co-sputter deposited by simultaneously exposing copper and magnesium targets to an argon plasma. In sputtering, the deposition rate increases with the sputtering power. S. P. Murarka, *Metallization Theory and Practice for VLSI and ULSI* (Butterworth, N.Y., 1992). In the present experiment, the magnesium contents in copper were controlled by supplying different power levels to the magnesium target while keeping the copper target power supply at 2.5 kW. The base pressure in the vacuum chamber was $5.0 \times 10^{-7}$ Torr. The argon pressure during sputtering was 5.0 mTorr. Films with a nominal thickness of 0.5 microns were deposited onto thermally grown $SiO_2$ on silicon wafers.

After deposition, the film thicknesses and magnesium/copper ratios were determined by Rutherford backscattering (RBS) using 3 MeV$^4$He$^+$. Resistivities were measured using a four-point probe. Samples were tested for oxidation by measuring oxidation rate at 300° C. and 350° C. in air as described in earlier publications. P. J. Ding, et al., *Proc. MRS Symp.* 260, 757 (1992); P. J. Ding, et al., *J. Appl. Phys.* 74, 1331 (1993). The scotch tape test was used as a measure of film adhesion on $SiO_2$.

EXAMPLE 2

Oxidation of the Copper Films

Figure 3:
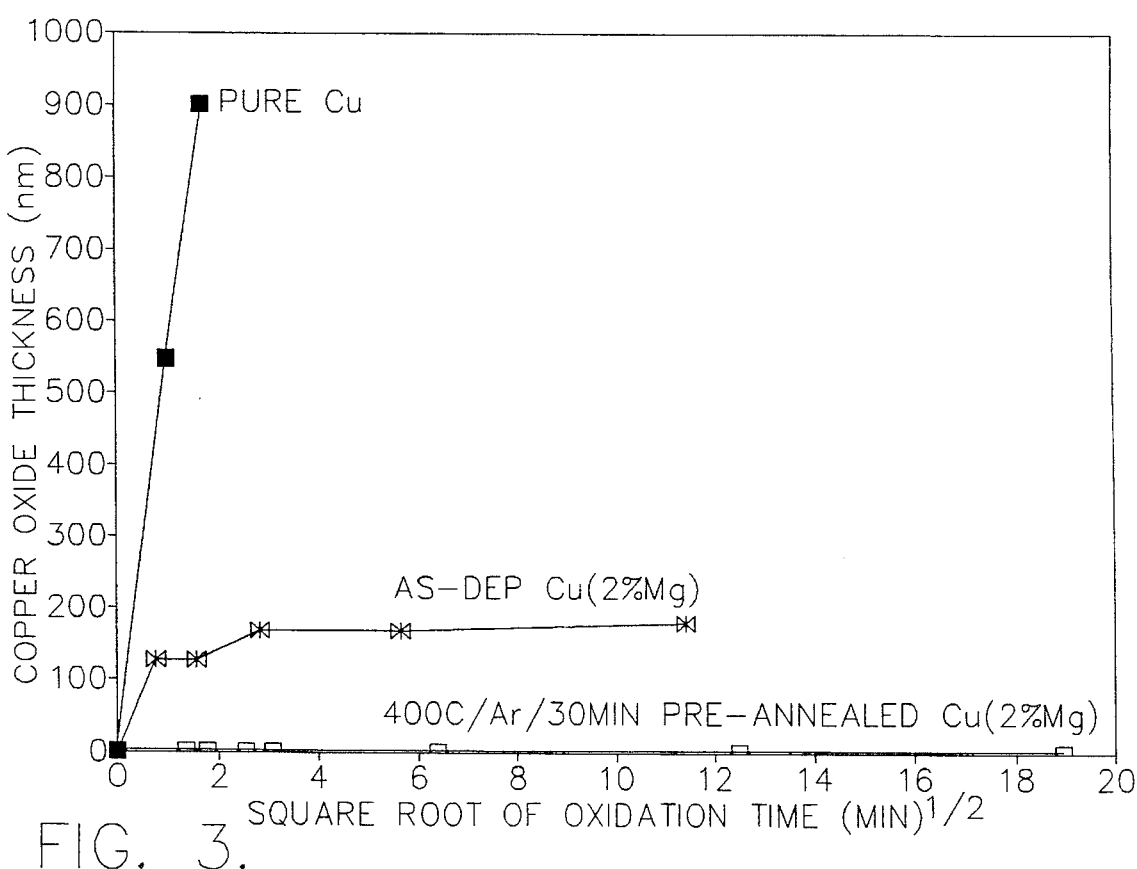
FIG. 3 is a graph illustrating oxidation kinetics for pure copper, as-deposited copper(2 atomic magnesium) and argon-annealed copper(2 atomic % magnesium) films at 350° C. in air.

The oxidation of pure copper films and copper with 2 atomic % magnesium was carried out in air at 300° C. and 350° C. for different times. After oxidation, the thickness and composition of copper oxide were determined by RBS. FIG. 3 shows typical data for the oxidation of samples heated in air at 350° C. for various times. Data are shown for pure copper, for as-deposited copper(2 at % Mg), and for copper(2 at % Mg) films which were argon-annealed (at 400° C. for 30 minutes in argon ambient) after deposition. The pure copper data have been truncated to fit on this graph. P. J. Ding, et al., *Proc. MRS Symp.* 309, 455 (1993).

Contrasted to pure copper, the as-deposited copper(2 at % Mg) films oxidize much more slowly (see FIG. 3). This material quickly develops a surface oxide (130 nm thick) which then grows very slowly. Analysis of the RBS and X-ray diffraction data shows that the oxide which forms on this material is CuO. This is to be contrasted with the oxide $Cu_2O$ which forms on pure copper.

Also shown in FIG. 3 are the results of the oxidation of the argon-annealed copper(2 at % Mg) samples. These films are found to be even more inert than the as-deposited copper(2 at % Mg) films. Analysis of the RBS data shows that after annealing, these alloy films formed a thin (6 nm) film of magnesium oxide on the sample surface, which stops further oxidation.

Figure 4A:
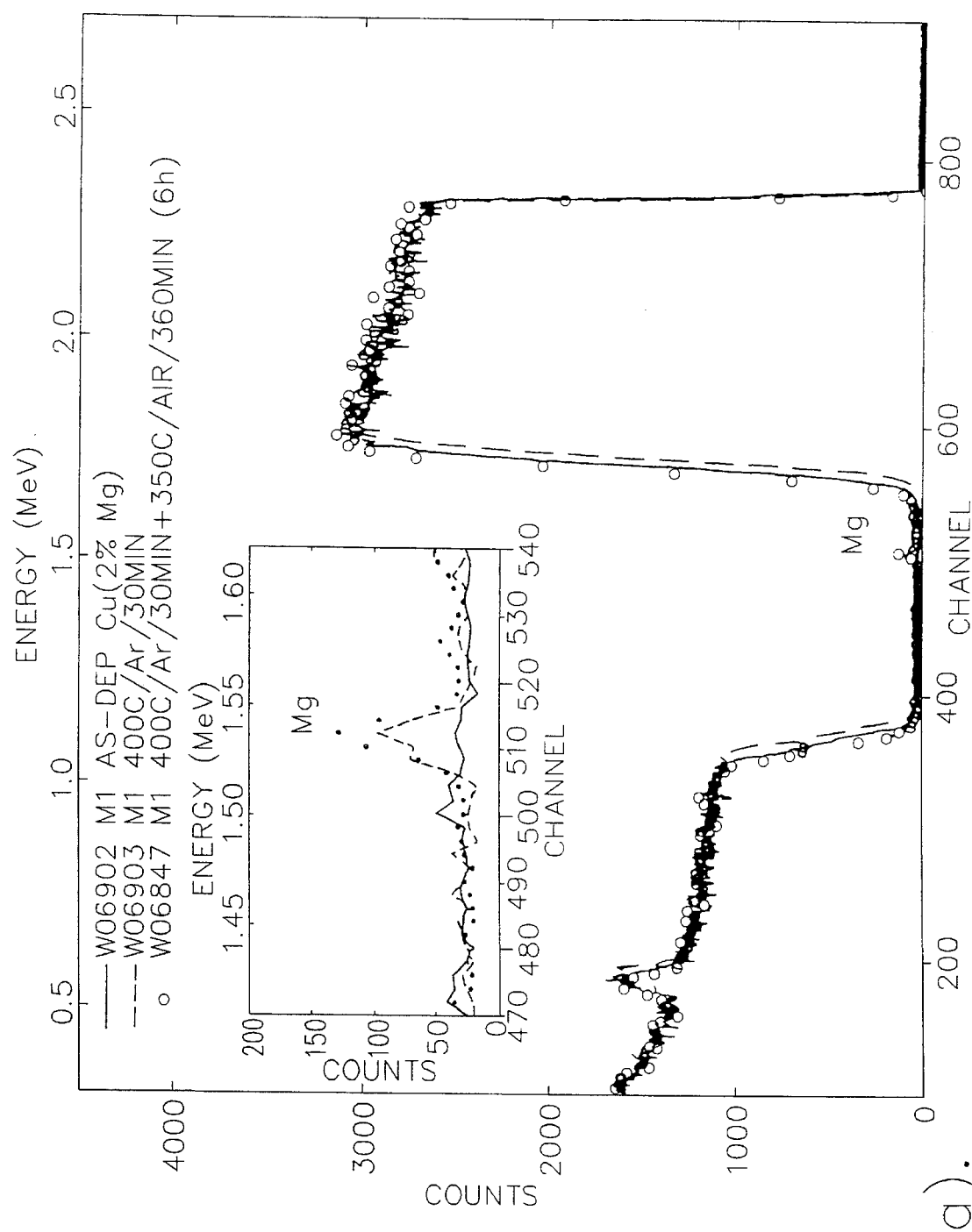
FIG. 4(a) is a graph illustrating an RBS spectra of an as-deposited copper(2 atomic % magnesium) film, a film after annealing at 400° C. in argon for 30 minutes, and a film annealed in argon and subsequently heated for 6 hours in air.
Figure 4B:
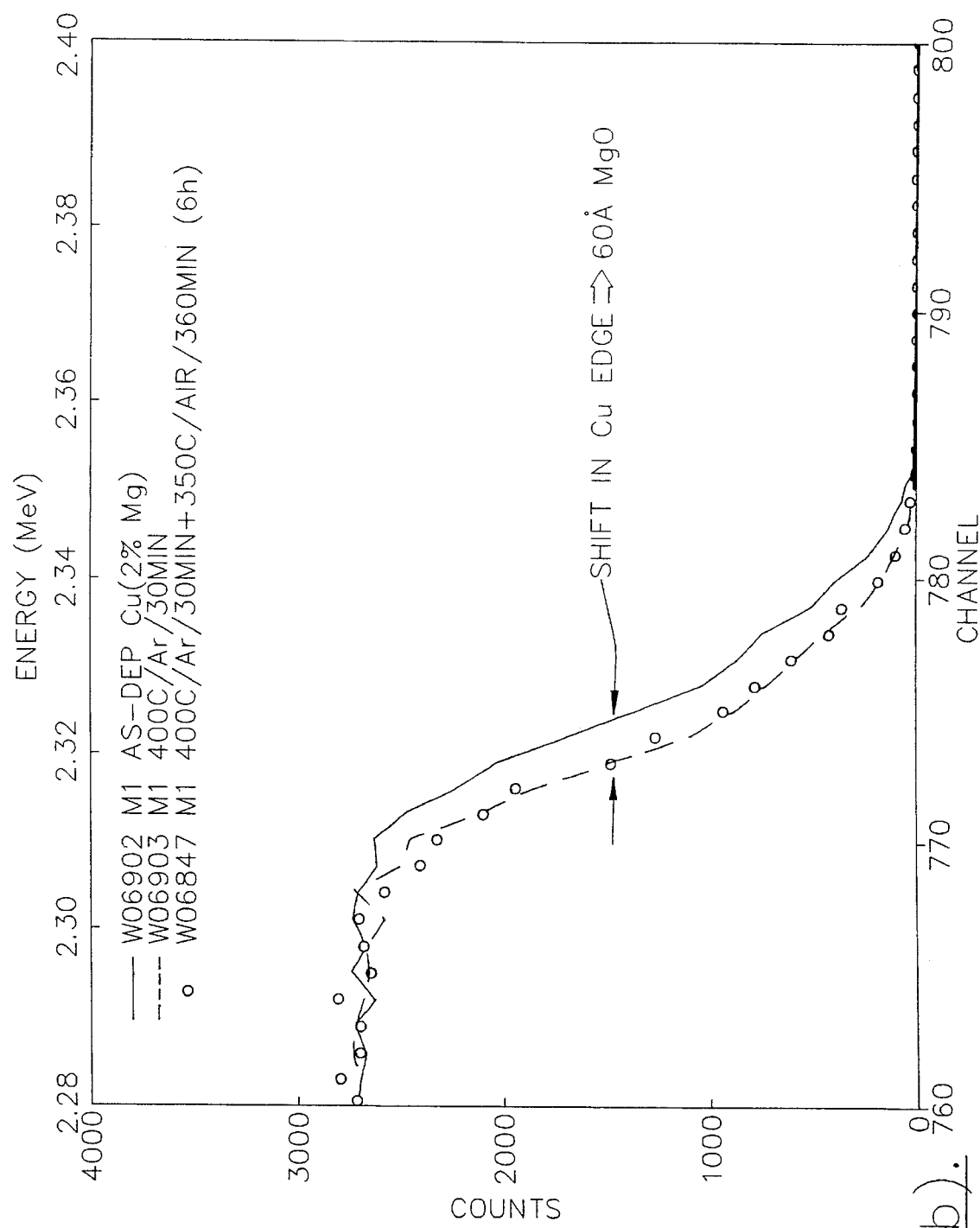
FIG. 4(b) is a graph illustrating enlargement of the copper edges in RBS spectra shown in FIG. 3(a)

FIG. 4(a) shows RBS spectra for an as-deposited copper(2 at % Mg) film, the film annealed at 400° C. for 30 minutes in argon ambient, and the argon-annealed film which also experienced the oxidation at 350° C. for 6 hours in air. When the magnesium surface region (around channel 520) is enlarged (insert diagram in FIG. 4(a)), it is seen that as a result of annealing, the magnesium has accumulated at the sample surface. In addition, careful analysis of the position of the copper edge shows that after annealing this edge has shifted slightly to lower channels, indicating a thin surface layer covering the copper. See FIG. 4(b). Both the amount of surface magnesium and the shift in the copper edge indicate the presence of approximately 6 nm of magnesium oxide on the surface. This 6 nm surface layer of magnesium oxide is a remarkably effective barrier to further oxidation. Oxidation studies were also carried out at 300° C. and the measurements show the same features for the magnesium-copper alloy as the 350° C. data in FIG. 3 and FIGS. 4(a) and 4(b).

EXAMPLE 3

Copper Film Resistivity

Figure 5:
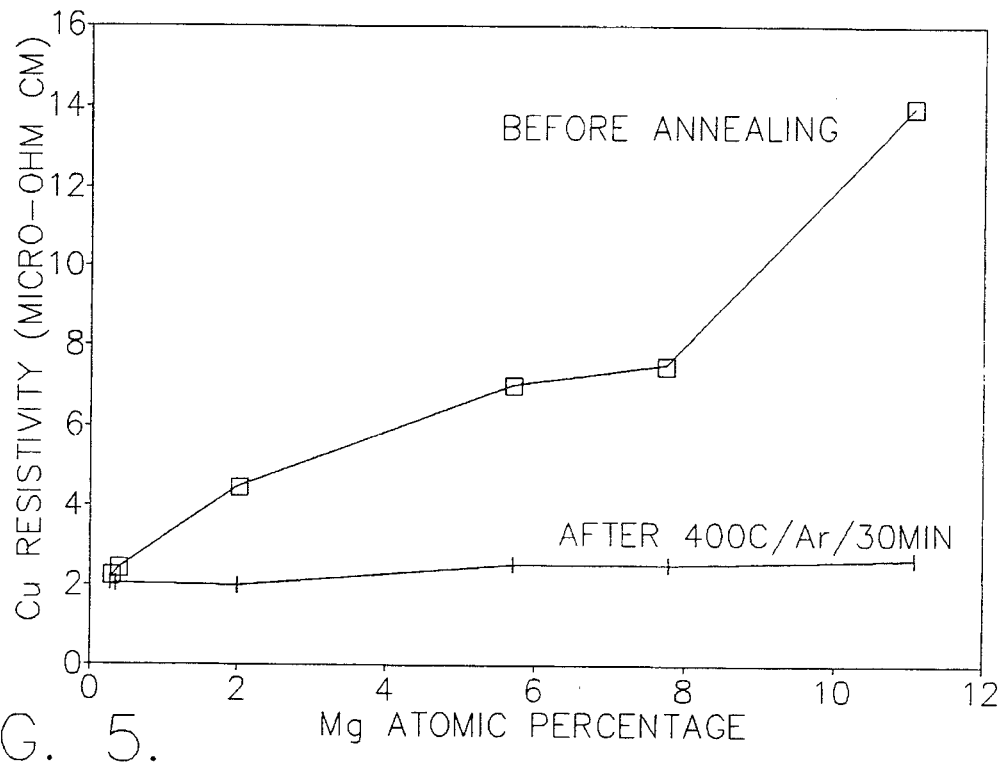
FIG. 5 is a graph illustrating film resistivity as a function of magnesium percentage in copper films.

The film resistivity is a key parameter for electronic applications. FIG. 5 shows the resistivity of as-deposited and argon-annealed films versus the magnesium percentage in the films. Although resistivity increases with the addition of magnesium, argon annealing (at 400° C. for 30 minutes) causes the Cu(Mg) film resistivity to drop dramatically to a value that approaches the result for pure sputtered copper (2.0 $\mu\Omega$–cm). For example, for copper(2 at % Mg) after annealing, the resistivity is 2.0 $\mu\Omega$–cm. Films made with even rather large amounts of magnesium, after the argon annealing, have resistivity nearly that of pure sputtered copper. This wide range of suitable magnesium contents is believed to be an important point in manufacturing where precise control of the magnesium content could be difficult.

Figure 6:
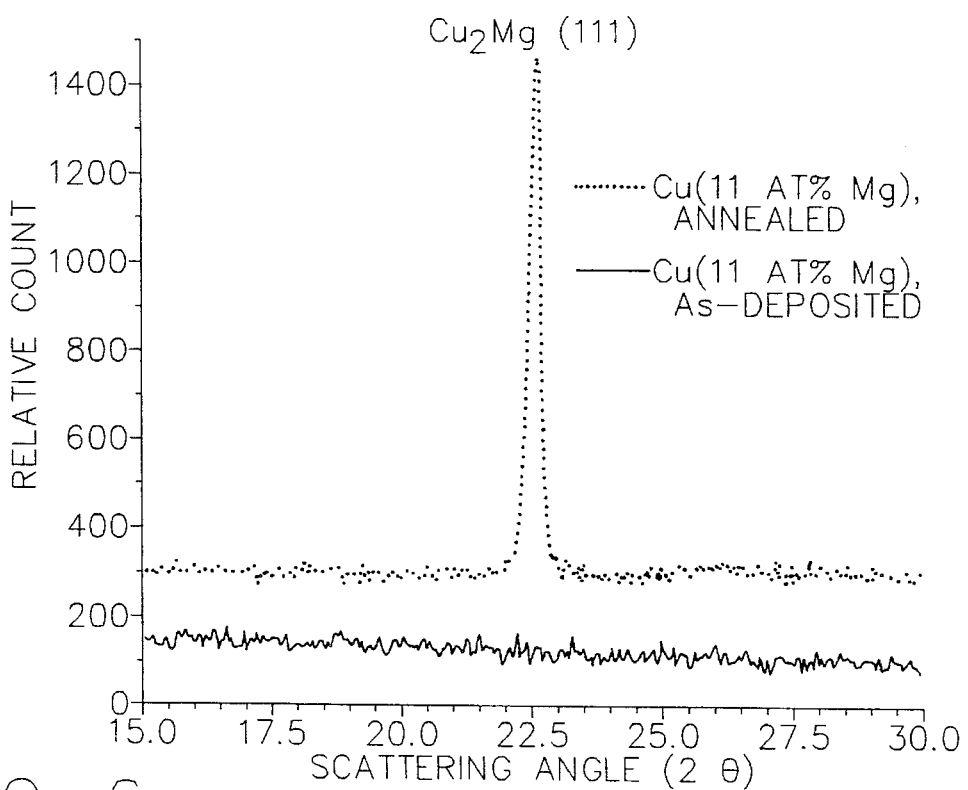
FIG. 6 is a graph illustrating X-ray diffraction of as-deposited copper with 11 atomic % magnesium and the same film after argon annealing.

As noted above, although the inventors do not wish to be bound by any explanation of the present invention, the mechanism responsible for the dramatic drop in resistivity is presently believed to be the result of the formation of a low resistivity copper-magnesium alloy, $Cu_2Mg$. M. Hansen, *Constitution Binary Alloys*, (McGraw-Hill Book Company, Inc., New York, 1958) p. 594. The resistivity of $Cu_2Mg$ is approximately 8.3 $\mu\Omega$–cm. Arcot, Ph.D. Thesis, RPI, 1992, Troy, New York; K. Schröder, *Handbook of Electrical Resistivities of Binary Metallic Alloys*, (CRC Press, Ohio, 1983). As shown in FIG. 6, X-ray diffraction analysis shows no measurable $Cu_2Mg$ in the as-deposited films, but after the argon annealing, $Cu_2Mg$ is clearly seen. Hence, the argon annealing is believed to in effect purify the copper by reducing the amount of magnesium mixed with the copper metal in two different ways. The first is the transport of magnesium to the surface where it forms the protective oxide, and the other is the formation of $Cu_2Mg$.

The presence MgO on a film's surface suggests the possibility that it may also be present at the interface between the metal and the $SiO_2$ substrate. Here, its formation would be the result of magnesium reduction of $SiO_2$ at the interface. The presence of magnesium oxide at this interface could affect other film properties. One is adhesion to $SiO_2$. Pure copper has very poor adhesion to $SiO_2$.

EXAMPLE 4

Copper Film Adhesion

The addition of magnesium to the copper also greatly improves its adhesion. For example, copper(2 at % Mg) films pass the scotch tape test while (under otherwise identical conditions) the tape removed 100% of pure copper films on $SiO_2$. The films remain adherent after anneals up to 700° C.

EXAMPLE 5

Copper Film Surface Characteristics

The addition of magnesium to copper also affects the film morphology during argon annealing. The surface of pure copper films which were annealed in argon at 400° C. for 30 minutes becomes very rough as a result of grain growth. However, copper(2 at % Mg) films remain microscopically smooth for the same annealing conditions. In fact, copper(2 at % Mg) films remain microscopically smooth when annealed up to 700° C. for 1 hour. This has been studied by both microscopy and by RBS.

Figure 7:
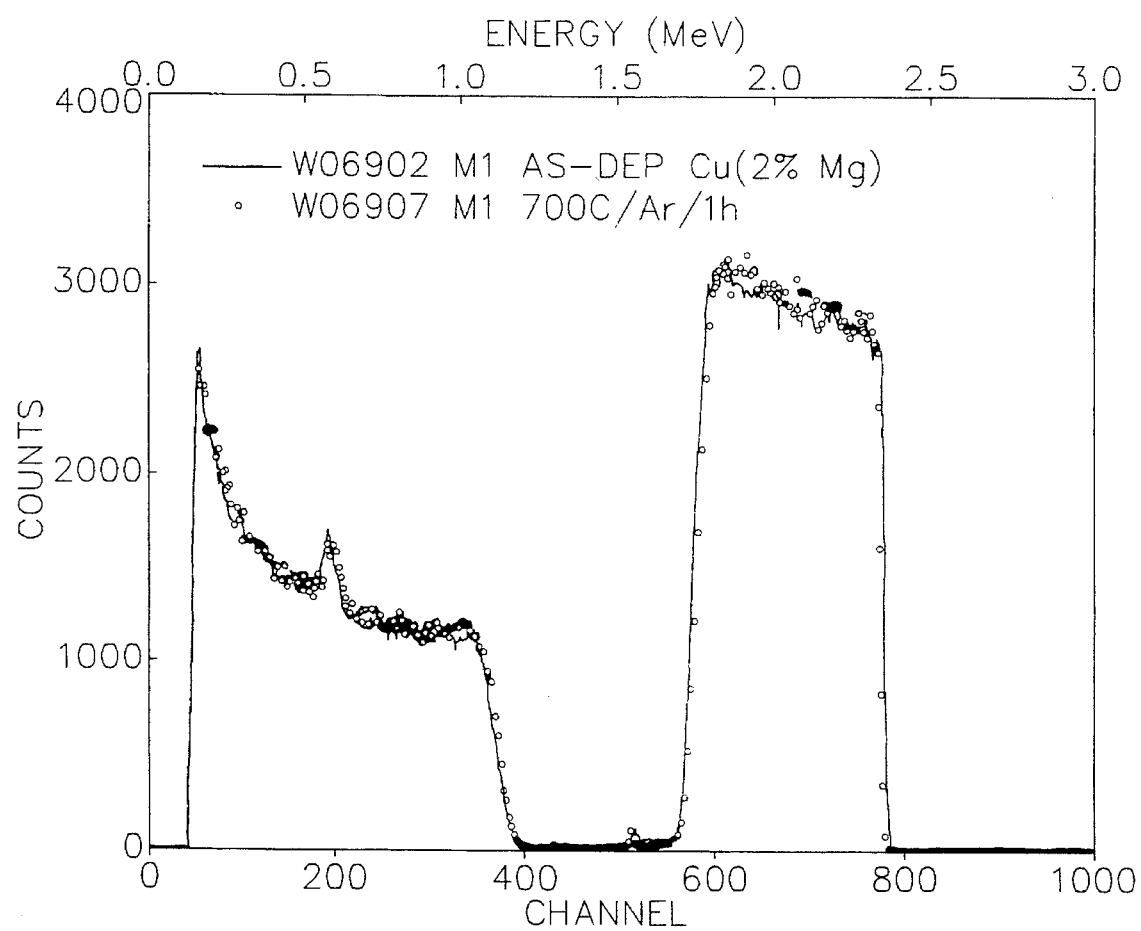
FIG. 7 is a graph illustrating RBS spectra of an as-deposited copper(2 atomic % magnesium) film and the film annealed at 700° C. for 1 hour in argon ambient.

For example, FIG. 7 shows RBS spectra of an as-deposited copper(2 at % Mg) films and a film annealed at 700° C. for 1 hour in argon. The two spectra are virtually identical, indicating that no surface roughening has occurred and that no diffusion of copper into the $SiO_2$ has occurred.

The foregoing examples are illustrative of the present invention, and are not to be construed as limiting thereof. The invention is defined by the following claims, with equivalents of the claims to be included therein.

That which is claimed is:

1. A process for forming an oxidation resistant, conductive copper layer on a substrate, comprising:

depositing copper and magnesium onto the surface of a substrate to form a copper layer comprising copper and magnesium distributed throughout the copper, said copper layer including magnesium in an amount sufficient to form an inert magnesium oxide layer at the surface of said copper layer upon treatment of said copper layer by annealing; and annealing said copper layer for a time sufficient and at a temperature sufficient to form an inert magnesium oxide layer at the surface of said copper layer.

2. The process according to claim 1 wherein said copper layer also comprises magnesium in an amount sufficient to form a conductive alloy with copper.

3. The process according to claim 1, wherein said magnesium is present in said copper layer in an amount of at least about one tenth of one atomic percent.

4. The process according to claim 1, wherein said magnesium is present in said copper layer in an amount of at least one atomic percent.

5. The process according to claim 1, wherein said magnesium is present in said copper layer in an amount of two atomic percent.

6. The process according to claim 1 wherein said annealed copper layer has a resistivity of about 2 $\mu\Omega$·cm.

7. The process according to claim 1 wherein said deposition step comprises sputtering said copper layer onto said substrate.

8. The process according to claim 7, wherein said sputtering step comprises simultaneously exposing a copper target and a magnesium target to an argon plasma.

9. The process according to claim 1 wherein said annealing step comprises heating said copper layer to a temperature of from about 275° C. to about 400° C. in an inert atmosphere for about thirty minutes.

10. A process for forming an oxidation resistant, conductive copper layer on a substrate, comprising:

sputtering copper and magnesium onto the surface of a substrate to form a copper layer consisting essentially of copper and magnesium distributed throughout the copper, said copper layer comprising magnesium in an amount of about two atomic percent;

annealing said copper layer in an inert atmosphere for at least about thirty minutes to a temperature of from about 275° C. to about 400° C. to form an inert magnesium oxide layer at the surface of said copper layer.

11. The process according to claim 10 wherein said copper layer also comprises magnesium in an amount sufficient to form a conductive alloy with copper.

12. The process according to claim 10 wherein said annealed copper layer has a resistivity of about 2 $\mu\Omega$·cm.

13. The process according to claim 10, wherein said sputtering step comprises simultaneously exposing a copper target and a magnesium target to an argon plasma.

14. A process for forming an oxidation resistant, conductive copper layer on a substrate, comprising depositing copper and magnesium onto the surface of a substrate to form a copper layer consisting essentially of copper and magnesium distributed throughout the copper, said copper layer including magnesium in an amount of at least about one atomic percent; and annealing said layer for a time sufficient and at a temperature sufficient to form an inert magnesium oxide layer at the surface thereof.

* * * * *